United States Patent
Suzuki et al.

(10) Patent No.: US 9,252,746 B2
(45) Date of Patent: Feb. 2, 2016

(54) CONTROL DEVICE, FREQUENCY CONTROL METHOD, AND RECEIVING DEVICE

(71) Applicant: FUJITSU LIMITED, Kawasaki-shi, Kanagawa (JP)

(72) Inventors: Yusuke Suzuki, Fujisawa (JP); Hideyuki Kannari, Yokohama (JP); Hiroyuki Sekino, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 97 days.

(21) Appl. No.: 14/169,206

(22) Filed: Jan. 31, 2014

(65) Prior Publication Data
US 2014/0287707 A1    Sep. 25, 2014

(30) Foreign Application Priority Data

Mar. 21, 2013    (JP) .................. 2013-058519

(51) Int. Cl.
*H04B 1/10* (2006.01)
*H03J 7/02* (2006.01)

(52) U.S. Cl.
CPC ................ *H03J 7/02* (2013.01); *H04B 1/1036* (2013.01)

(58) Field of Classification Search
CPC ........ H04B 1/10; H04B 1/1036; H04N 12/06; H03J 7/02
USPC ........... 455/67.11, 226.1, 255–257, 260, 295, 455/296, 307, 334, 339; 375/343, 344, 345
See application file for complete search history.

(56) References Cited

U.S. PATENT DOCUMENTS

| | | | | |
|---|---|---|---|---|
| 5,307,515 | A * | 4/1994 | Kuo et al. | 455/295 |
| 7,155,196 | B1 * | 12/2006 | Beard | 455/296 |
| 7,702,306 | B2 * | 4/2010 | McMullin et al. | 455/226.1 |
| 2004/0223085 | A1 | 11/2004 | Kwak | |
| 2010/0304677 | A1 * | 12/2010 | Pop et al. | 455/67.11 |

FOREIGN PATENT DOCUMENTS

| | | |
|---|---|---|
| JP | 04-360441 | 12/1992 |
| JP | 08-321789 | 12/1996 |
| JP | 11-186923 | 7/1999 |
| JP | 2004-336715 | 11/2004 |

* cited by examiner

*Primary Examiner* — Thanh Le
(74) *Attorney, Agent, or Firm* — Fujitsu Patent Center

(57) ABSTRACT

A control device of a receiving device includes an interference wave detector that detects an interference wave within an intermediate frequency band in a signal converted by a mixer that converts a reception signal of a radio frequency band with a certain radio frequency as a center into an intermediate signal of the intermediate frequency band based on a signal of a local oscillation frequency different from the radio frequency. The control device further includes a frequency controller that changes the local oscillation frequency so that the intermediate frequency band gets away from a band of the interference wave when the interference wave is detected.

17 Claims, 12 Drawing Sheets

000
CONTROL DEVICE, FREQUENCY CONTROL METHOD, AND RECEIVING DEVICE

CROSS-REFERENCE TO RELATED APPLICATION

This application is based upon and claims the benefit of priority of the prior Japanese Patent application No. 2013-58519, filed on Mar. 21, 2013, the entire contents of which are incorporated herein by reference.

FIELD

The present invention relates to a control device, a frequency control method, and a receiving device.

BACKGROUND

Receiving devices that receive a radio signal of a radio frequency band with a radio frequency received through an antenna as a center have been known. For example, this type of receiving device includes a local oscillator that generates a local signal of a local frequency different from a radio frequency and a mixer that converts a radio signal received through an antenna into an intermediate signal of an intermediate frequency band based on the local signal. The receiving device further includes a filter that attenuates a signal outside the intermediate frequency band in the signal converted by the mixer at a stage subsequent to the mixer.

There are cases in which the antenna receives an interference wave of a band near the radio signal together with the radio signal. In this case, the mixer converts the radio signal into an intermediate signal IS1, and converts the interference wave into an interference wave IW1 of a band near the intermediate frequency band as illustrated in FIG. 1 (A). However, the filter gradually decreases in transmissivity as it gets away from the intermediate frequency band as indicated by an alternate long and short dash line FL1. Here, the transmissivity refers to a ratio of a level of a signal output from the filter to a level of a signal input to the filter.

Thus, it is difficult for the filter to sufficiently attenuate a signal of a band FW1 which is outside the intermediate frequency band but near the intermediate frequency band. As a result, the intermediate interference wave IW1 passes through the filter without being sufficiently attenuated.

In this regard, for example, a technique in which a receiving device detects a band of an intermediate interference wave, and changes a local frequency based on the detected band so that an intermediate interference wave IW1 has a band FW2 which is sufficiently attenuated by the filter as illustrated in FIG. 1 (B) (e.g., see Japanese Laid-open Patent Publication No. 11-186923). As a result, the intermediate interference wave IW1 can be sufficiently attenuated by the filter.

Further, notch filters that attenuate a signal within a certain removal band have been known (e.g., see Japanese Laid-open Patent Publication No. 04-360441 and Japanese Laid-open Patent Publication No. 2004-336715).

Meanwhile, for example, there are cases in which the interference wave within the intermediate frequency band received by the antenna reaches the side subsequent to the mixer without undergoing frequency conversion by the mixer, or cases in which the interference wave within the intermediate frequency band comes into the receiving device at the side subsequent to the mixer, for example, due to an insufficient separation (isolation) between two signals input to the mixer or characteristics of circuit elements. In this case, it is difficult to change the band of the interference wave even when the local frequency is changed as in the above-described receiving device. Particularly, when a housing made of a material such as synthetic resin is used in order to lighten the receiving device, the interference wave is hardly attenuated due to the housing, and thus this problem becomes more remarkable.

In this regard, the interference wave is considered to be sufficiently attenuated using the notch filter. In this case, however, since the intermediate signal as well as the interference wave is attenuated, the quality of a reception signal deteriorates. In this manner, the above-described receiving device has a problem in that the quality of a reception signal deteriorates.

SUMMARY

According to an aspect of an embodiment, a control device includes an interference wave detector that detects an interference wave within an intermediate frequency band in a signal converted by a mixer that converts a reception signal of a radio frequency band with a certain radio frequency as a center into an intermediate signal of the intermediate frequency band based on a signal of a local oscillation frequency different from the radio frequency. The control device further includes a frequency controller that changes the local oscillation frequency so that the intermediate frequency band gets away from a band of the interference wave when the interference wave is detected.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF EMBODIMENTS

Hereinafter, in order to solve at least one of the above-mentioned problems, exemplary embodiments of a control device, a frequency control method, and a receiving device according to the present invention will be described with reference to FIGS. 2 to 12.

<First Embodiment>

(Outline)

A transceiving device according to a first embodiment includes an oscillator and a mixer. The oscillator generates a local signal of a local oscillation frequency different from a certain radio frequency. The mixer converts a reception signal of a radio frequency band with a radio frequency as a center into an intermediate signal of an intermediate frequency band based on the generated local signal.

Further, the transceiving device includes an interference wave detector that detects an interference wave within the intermediate frequency band in the signal converted by the mixer and a frequency controller that changes the local oscillation frequency so that the intermediate frequency band gets away from a band of the interference wave when the interference wave is detected.

According to the above configuration, it is possible to cause the intermediate frequency band to get away from the band of the interference wave. Through this operation, it is possible to easily separate the signal within the intermediate frequency band from the interference wave. As a result, the quality of a reception signal can be increased.

Hereinafter, the transceiving device according to the first embodiment will be described in detail.

(Configuration)

Figure 1:
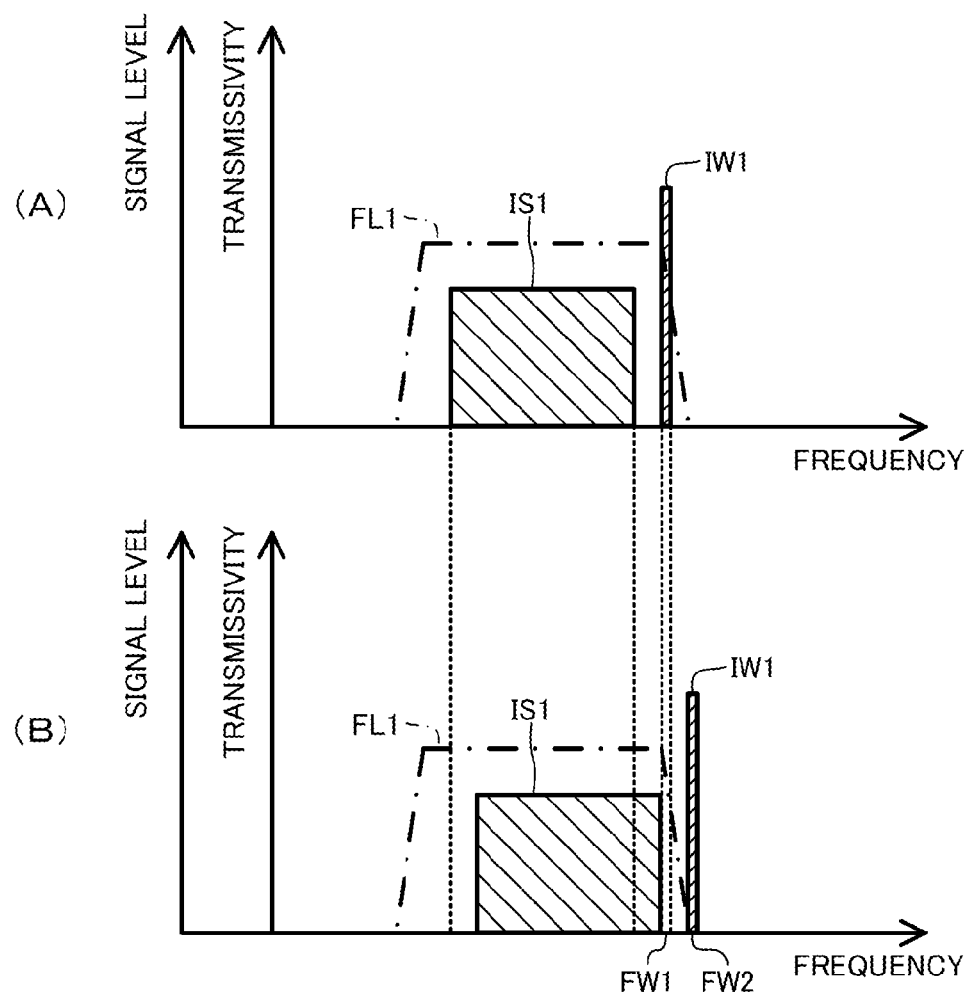
FIG. 1 is an explanatory diagram conceptually illustrating an intermediate signal and an interference wave in a related art.
Figure 2:
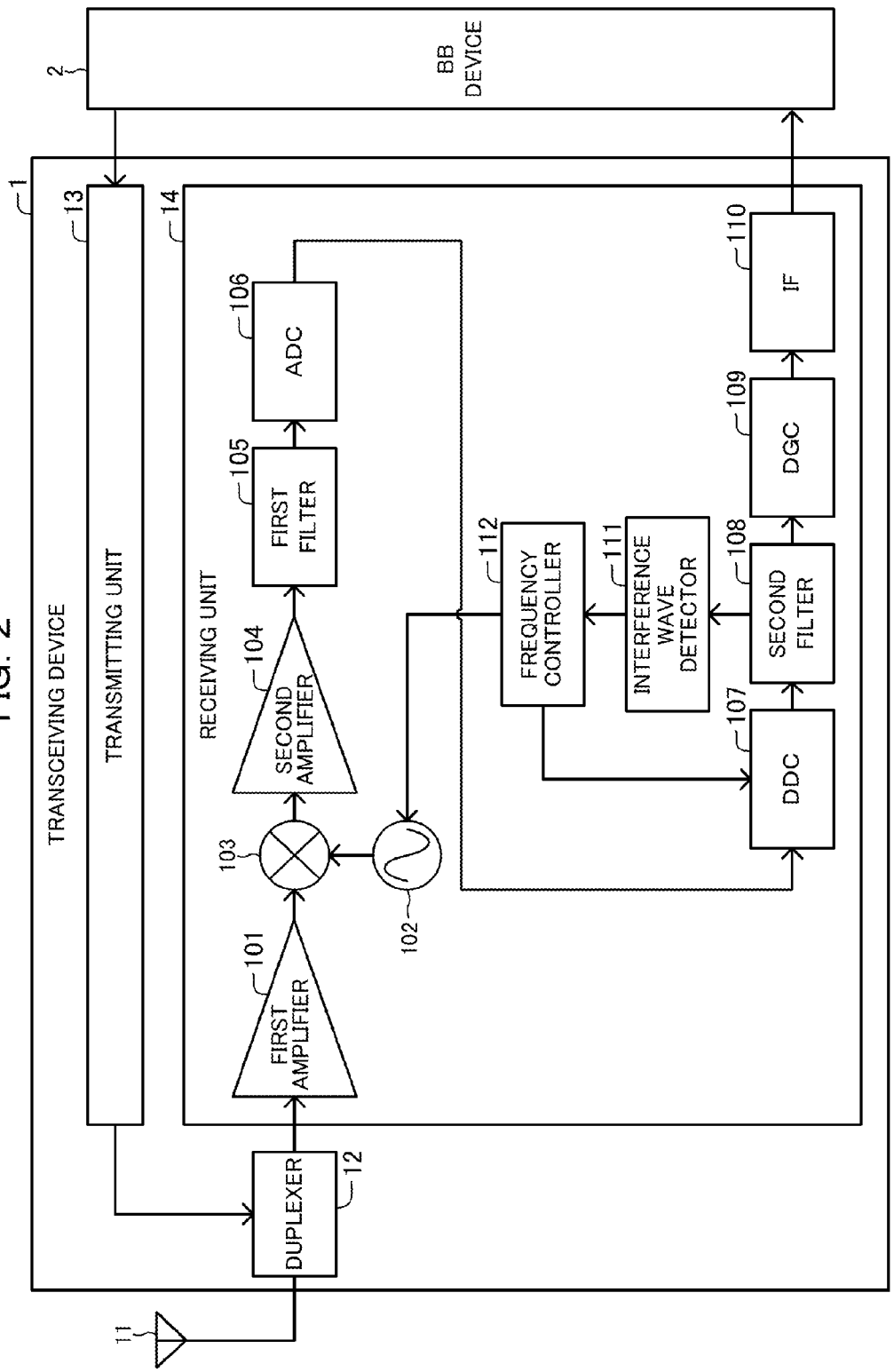
FIG. 2 is a diagram illustrating a configuration of a transceiving device according to a first embodiment.

A transceiving device 1 according to the first embodiment includes an antenna 11, a duplexer 12, a transmitting unit 13, and a receiving unit 14 as illustrated in FIG. 2. The transceiving device 1 is connected to a base band (BB) device 2. The transceiving device 1 is an example of a receiving device.

The BB device 2 generates a base band signal, and outputs the generated base band signal to the transceiving device 1. The base band signal is a signal of a certain base band. The BB device 2 receives the base band signal output from the transceiving device 1, and performs a certain base band process based on the received base band signal.

The antenna 11 receives a radio signal of a radio frequency band with a radio frequency $F_{RF}$ as a center. In the present example, the radio signal is transmitted from a wireless terminal (not illustrated). In the present example, the radio frequency band is a band having a frequency higher than the base band. The antenna 11 outputs the received radio signal to the receiving unit 14 through the duplexer 12.

Further, the antenna 11 receives a radio signal output from the transmitting unit 13 through the duplexer 12, and transmits the received radio signal.

The duplexer 12 is also called a duplexer. The duplexer 12 performs switching between a function of transmitting the radio signal and the function of receiving the radio signal. The duplexer 12 may have a function of removing a signal of a band other than the radio frequency band.

The transmitting unit 13 generates a radio signal based on the base band signal input from the BB device 2, and outputs the generated radio signal to the antenna 11 through the duplexer 12.

The receiving unit 14 includes a first amplifier 101, a local oscillator 102, a mixer 103, a second amplifier 104, a first filter 105, an analog to digital converter (ADC) 106, a digital down converter (DDC) 107, a second filter 108, a digital gain controller (DGC) 109, an interface (IF) 110, an interference wave detector 111, and a frequency controller 112. The interference wave detector 111, the frequency controller 112, the DDC 107, and the second filter 108 are an example of a control device.

In the present example, the DDC 107, the second filter 108, the DGC 109, the interference wave detector 111, and the frequency controller 112 may be configured with a field-programmable gate array (FPGA). Alternatively, the DDC 107, the second filter 108, the DGC 109, the interference wave detector 111, and the frequency controller 112 may be configured with a programmable logic device (PLD) rather than the FPGA.

Further, the DDC 107, the second filter 108, the DGC 109, the interference wave detector 111, and the frequency controller 112 may be configured with a logic device which cannot be programmable (e.g., an application specific integrated circuit (ASIC)). Further, the transceiving device 1 may be configured to include a computer provided with a processing device and a storage device storing a program (software), and the respective functions of the DDC 107, the second filter 108, the DGC 109, the interference wave detector 111, and the frequency controller 112 may be implemented as the program is executed by the processing device.

The first amplifier 101 amplifies the radio signal received through the antenna 11. In the present example, the first amplifier 101 is a low noise amplifier (LNA).

The local oscillator 102 generates a local signal of a local frequency (local oscillation frequency) $F_{LO}$ different from the radio frequency $F_{RF}$. In the present example, the local signal is an alternating current (AC) signal of a continuous wave. In the present example, the local frequency $F_{LO}$ is a frequency lower than the radio frequency $F_{RF}$. For example, the local oscillator 102 generates a local signal of a frequency represented by a first frequency control signal output from the frequency controller 112 as the local frequency $F_{LO}$.

The mixer 103 is also called a mixer. The mixer 103 converts the radio signal amplified by the first amplifier 101 into an intermediate signal of an intermediate frequency band based on the local signal generated by the local oscillator 102. In the present example, the mixer 103 is a mixer of a heterodyne type. In the present example, the intermediate frequency band is a frequency band which is higher than the base band but lower than the radio frequency band. In the present example, the mixer 103 converts the signal amplified by the first amplifier 101 so that the frequency thereof is lowered by the local frequency $F_{LO}$.

The second amplifier 104 amplifies the signal converted by the mixer 103, and outputs the amplified signal to the first filter 105.

The first filter 105 is configured to attenuate a signal outside a first passband among the signals which are output from the second amplifier 104 (i.e., the signals converted by the mixer 103). The first passband has a band width larger than the width of the intermediate frequency band (the intermediate frequency band width). For example, the width of the first passband (the first passband width) $W_{FP1}$ is preferably set to satisfy a condition represented by Mathematical Formula 1:

$$W_{IS}+W_{IW} \leq W_{FP1} \leq 2W_{IS}+W_{IW} \quad \text{(Mathematical Formula 1)}$$

Here, $W_{IS}$ represents the intermediate frequency band width. $W_{IW}$ represents a width of a band (band width) of the interference wave.

Figure 3:
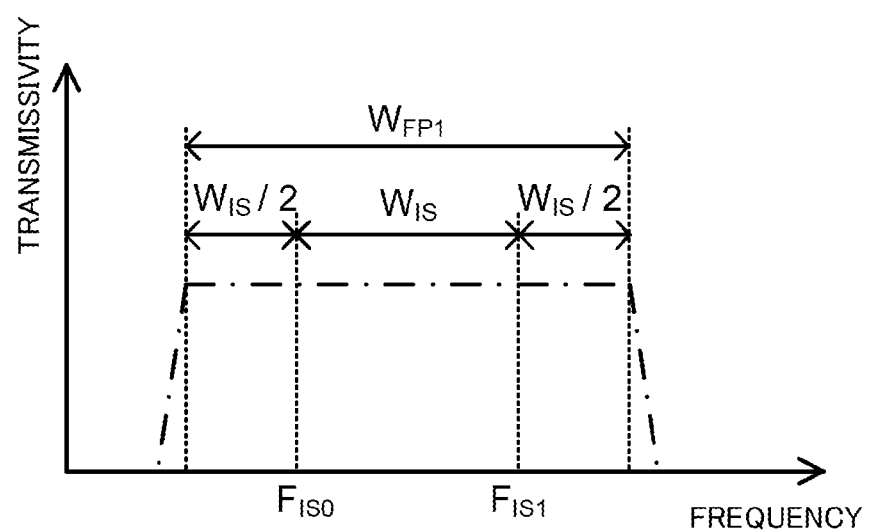
FIG. 3 is an explanatory diagram conceptually illustrating a first passband of a first filter according to the first embodiment.

In the present example, the first passband width $W_{FP1}$ is set to a value (i.e., $2W_{IS}$) which is twice as large as the intermediate frequency band width as illustrated in FIG. 3. A lower limit of the first passband is set to a value (i.e., $F_{IS0}-W_{IS}/2$) obtained by subtracting a value which is half the intermediate frequency band width $W_{IS}$ from a basic intermediate frequency $F_{IS0}$. The basic intermediate frequency $F_{IS0}$ is a basic value of an intermediate frequency $F_{IS}$. The intermediate frequency $F_{IS}$ is the center frequency of the intermediate frequency band.

In this specification, in the receiving unit 14, a direction from the first amplifier 101 to the IF 110 is referred to as a backward direction, and a direction from the IF 110 to the first amplifier 101 is referred to as a forward direction. In other words, the first filter 105 is arranged at the side subsequent to (behind) the mixer 103.

The ADC 106 converts the signal that has passed through the first filter 105 from an analog signal into a digital signal, and outputs the converted signal to the DDC 107.

The DDC 107 converts the signal output from the ADC 106 (i.e., the signal that has passed through the first filter 105) so that the frequency thereof is lowered by a frequency reduction amount $\Delta F_{RD}$ (i.e., performs down conversion). In the present example, the DDC 107 includes a numerical controlled oscillator (NCO).

The frequency reduction amount $\Delta F_{RD}$ is set to the difference (in the present example, a value ($=F_{IS}-F_{BB}$) obtained by subtracting a base frequency $F_{BB}$ from the intermediate frequency $F_{IS}$) between the intermediate frequency $F_{IS}$ and the base frequency $F_{BB}$. The base frequency $F_{BB}$ is the center frequency of the base band. In other words, the DDC 107 converts the signal that has passed through the first filter 105 so that the intermediate signal of the intermediate frequency band is converted into the base band signal of the base band.

For example, the DDC 107 converts the signal so that the frequency thereof is lowered by the frequency reduction amount $\Delta F_{RD}$ represented by a second frequency control signal output from the frequency controller 112. As will be described later, the frequency reduction amount $\Delta F_{RD}$ is set to a value ($=F_{RF}-F_{LO}-F_{BB}$) obtained by subtracting the base frequency $F_{BB}$ from a value obtained by subtracting the local frequency $F_{LO}$ from the radio frequency $F_{RF}$. Meanwhile, the value obtained by subtracting the local frequency $F_{LO}$ from the radio frequency $F_{RF}$ is equal to the intermediate frequency $F_{IS}$. Thus, the frequency reduction amount $\Delta F_{RD}$ is set to a value ($=F_{IS}-F_{BB}$) obtained by subtracting the base frequency $F_{BB}$ from the intermediate frequency $F_{IS}$.

The DDC 107 outputs the converted signal to the second filter 108.

As described above, the DDC 107 converts the signal that has passed through the first filter 105 based on the local frequency $F_{LO}$ so that the frequency thereof changes by the difference between the intermediate frequency $F_{IS}$ and the base frequency $F_{BB}$.

In the present example, the DDC 107 is an example of a frequency converter.

The second filter 108 is configured to attenuate a signal outside a second passband in the signal output from the DDC 107 (i.e., the signal converted by the DDC 107). The second passband is approximately identical to the base band. In other words, the second passband has the band width approximately equal to the width of the base band (the base band width). Further, the center frequency of the second passband is approximately identical to the base frequency $F_{BB}$. The second filter 108 is arranged at the side subsequent to (behind) the DDC 107.

The DGC 109 adjust a level of the signal that has passed through the second filter 108 to have a level within a previously set level range, and outputs the adjusted signal to the IF 110.

The IF 110 converts the signal output from the DGC 109 to have a certain format (in the present example, a common packet radio interface (CPRI) format), and outputs the converted signal (the base band signal) to the BB device 2.

Figure 4:
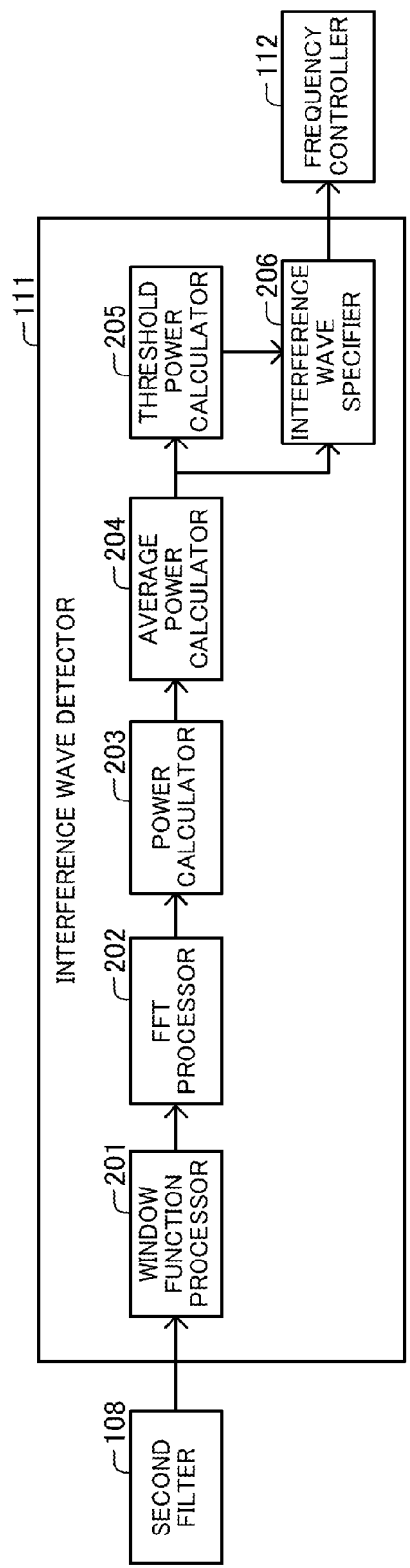
FIG. 4 is a diagram illustrating a configuration of an interference wave detector according to the first embodiment.

The interference wave detector 111 detects the interference wave within the intermediate frequency band in the signal that has passed through the second filter 108 (i.e., the signal converted by the mixer 103). For example, the interference wave detector 111 includes a window function processor 201, an FFT processor 202, a power calculator 203, an average power calculator 204, a threshold power calculator 205, and an interference wave specifier 206 as illustrated in FIG. 4.

The window function processor 201 performs a process of multiplying the signal that has passed through the second filter 108 by a window function in units of certain signal blocks. The signal blocks are generated by dividing the signal in units of certain time intervals (in units of certain time frames).

The FFT processor 202 performs Fourier transform (in the present example, fast Fourier transform (FFT)) on the signal processed by the window function processor 201 in units of signal blocks.

The power calculator 203 calculates power of each frequency for each signal block based on data of a real part and data of an imaginary part (IQ data) of the signal which has been subjected to Fourier transform by the FFT processor 202.

The average power calculator 204 calculates an average power value of each frequency obtained by averaging the powers of frequencies calculated by the power calculator 203 for a plurality of signal blocks (in the present example, 16 signal blocks).

The threshold power calculator 205 calculates a reference value by averaging average power values obtained by excluding a certain exclusion number (in the present example, 64) from the average power values of the respective frequencies calculated by the average power calculator 204 in the descending order of the values. Further, the threshold power calculator 205 calculates a value obtained by adding a certain marginal value to the calculated reference value as interference wave threshold power.

The interference wave specifier 206 determines whether at least one of the average power values of the respective frequencies calculated by the average power calculator 204 is larger than the threshold power calculated by the threshold power calculator 205. In the present example, when at least one of the average power values of the respective frequencies is larger than the threshold power, for example, it means that the interference wave within the intermediate frequency band is detected in the signal.

When the interference wave within the intermediate frequency band is detected in the signal, the interference wave specifier 206 outputs interference wave information representing an average power value (interference wave power) larger than the threshold power among the calculated average power values of the respective frequencies and the frequency (interference wave frequency) corresponding to the average power value to the frequency controller 112. In the present example, the interference wave specifier 206 does not output the interference wave information when the interference wave within the intermediate frequency band is not detected in the signal. Further, when the interference wave within the intermediate frequency band is not detected in the signal, the interference wave specifier 206 may output null information or information representing that the interference wave has not been detected to the frequency controller 112 as the interference wave information.

When the interference wave is detected by the interference wave detector 111, the frequency controller 112 changes the local frequency $F_{LO}$ so that the intermediate frequency band gets away from the band of the interference wave. For example, the frequency controller 112 changes the local frequency $F_{LO}$ so that the intermediate frequency band is arranged outside the band of the interference wave.

Further, in the present example, the frequency controller 112 changes the local frequency $F_{LO}$ so that the intermediate frequency band gets away from the band of the interference wave within the first passband.

For example, the frequency controller 112 selects the local frequency $F_{LO}$ in a range from a lower limit value $F_{th}$ to a basic local frequency $F_{LO0}$ based on the interference wave information output from the interference wave detector 111. In the present example, the basic local frequency $F_{LO0}$ is a value ($=F_{RF}-F_{IS0}$) obtained by subtracting the basic intermediate frequency $F_{IS0}$ from the radio frequency $F_{RF}$.

The lower limit value $F_{th}$ is preferably set so that the frequency band (i.e., the intermediate frequency band) of the intermediate signal converted by the mixer 103 be included within the first passband of the first filter 105. In the present example, the lower limit value $F_{th}$ is a local frequency with which the intermediate frequency of the intermediate signal converted by the mixer 103 becomes the upper limit frequency $F_{IS1}$. Here, the upper limit frequency $F_{IS1}$ is a value ($=F_{IS0}+W_{IS}$) obtained by adding the intermediate frequency band width $W_{IS}$ to the basic intermediate frequency $F_{IS0}$ as illustrated in FIG. 3. In other words, the lower limit value $F_{th}$ is a value ($=F_{LO0}-W_{IS}$) obtained subtracting the intermediate frequency band width $W_{IS}$ from the basic local frequency $F_{LO0}$.

When there is a local frequency with which a representative interference wave power is smaller than a certain permissible power, the frequency controller 112 selects the corresponding local frequency. The representative interference wave power is a representative value of the interference wave power. In the present example, the representative interference wave power is a maximum value of the interference wave power. Alternatively, the representative interference wave power may be an average value of the interference wave power.

Meanwhile, when there is no local frequency with which a representative interference wave power is smaller than the permissible power, the frequency controller 112 selects the local frequency which minimizes the representative interference wave power.

The frequency controller 112 outputs the first frequency control signal representing the selected local frequency $F_{LO}$ to the local oscillator 102.

Further, the frequency controller 112 calculates a value ($=F_{RF}-F_{LO}-F_{BB}$) obtained by subtracting the base frequency $F_{BB}$ from a value obtained from subtracting the selected local frequency $F_{LO}$ from the radio frequency $F_{RF}$ as the frequency reduction amount $\Delta F_{RD}$. In addition, the frequency controller 112 outputs the second frequency control signal representing the calculated frequency reduction amount $\Delta F_{RD}$ to the DDC 107.

(Operation)

Next, an operation of the transceiving device 1 will be described with reference to FIGS. 5 and 6.

Figure 5:
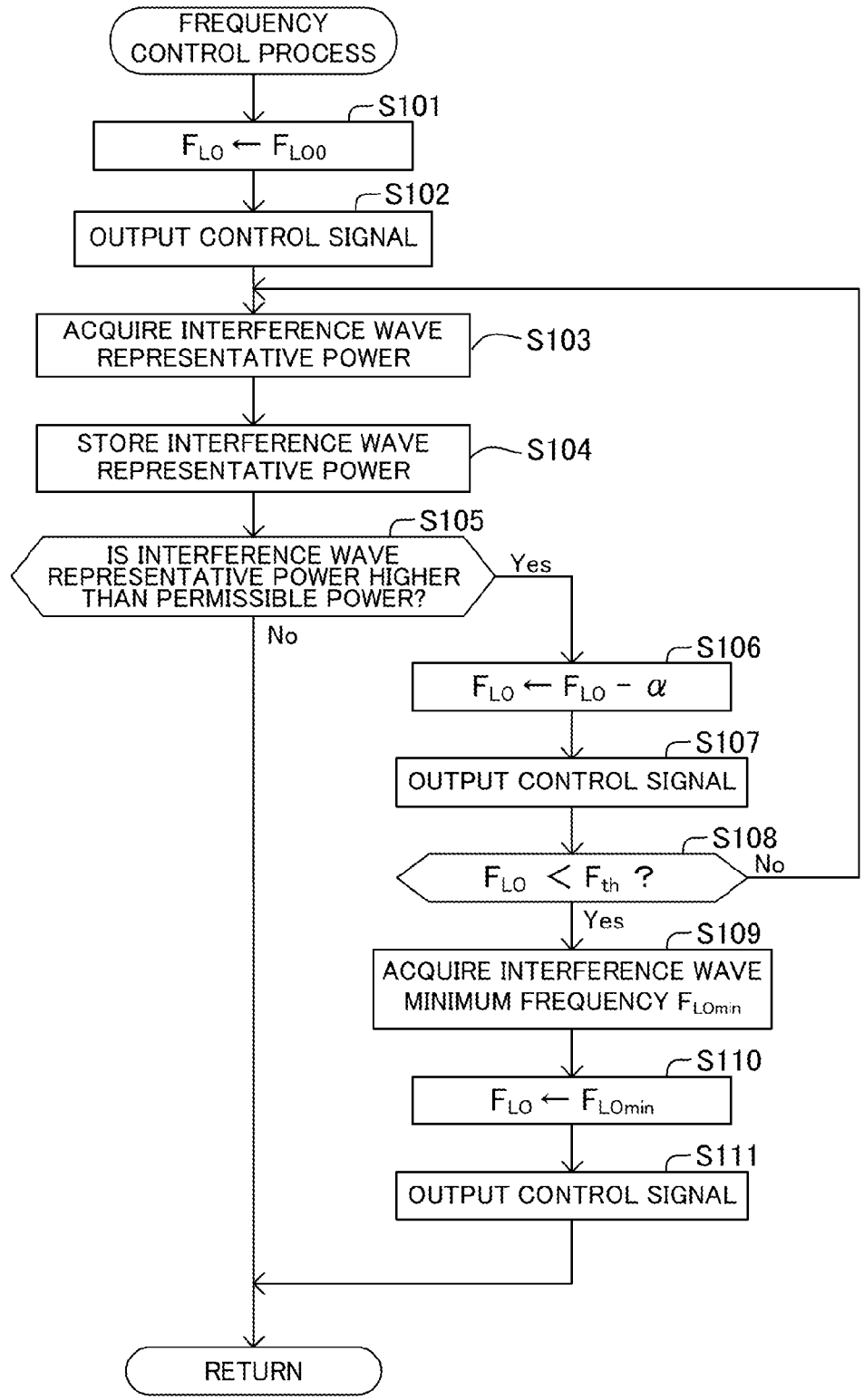
FIG. 5 is a flowchart illustrating a frequency control process performed by a frequency controller according to the first embodiment.
Figure 6:
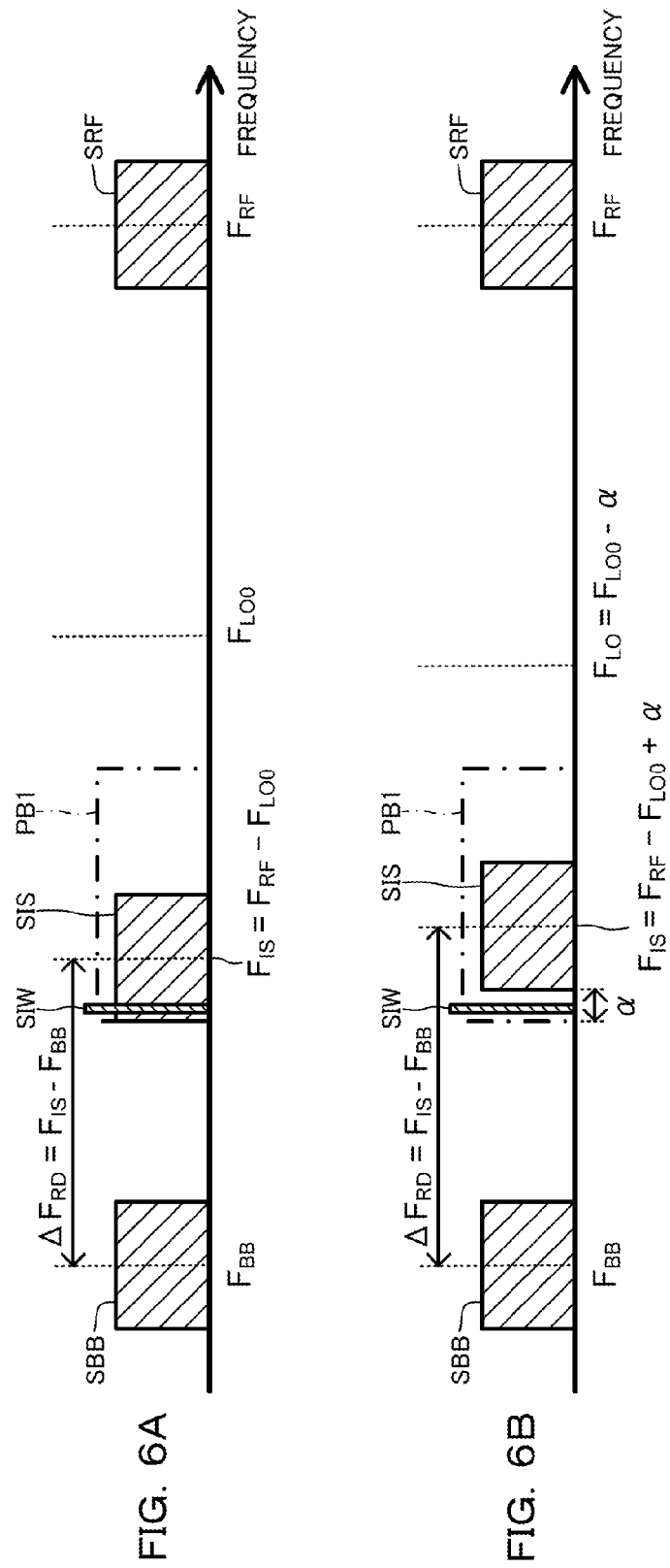
FIG. 6A is an explanatory diagram conceptually illustrating a relation between bands of signals before a local frequency is changed in the transceiving device according to the first embodiment.
FIG. 6B is an explanatory diagram conceptually illustrating a relation between bands of signals after a local frequency is changed in the transceiving device according to the first embodiment.

The frequency controller 112 performs a frequency control process illustrated in FIG. 5 at a certain timing. In the present example, the frequency controller 112 performs the frequency control process when the transceiving device 1 is activated. Further, the frequency controller 112 may perform the frequency control process each time when a certain execution period elapses or when the representative interference wave power is larger than a certain execution threshold value.

First of all, when execution of the frequency control process starts, the frequency controller 112 sets (selects) the basic local frequency $F_{LO0}$ as the local frequency $F_{LO}$ (step S101 of FIG. 5). Then, the frequency controller 112 outputs the first frequency control signal representing the selected local frequency $F_{LO}$ to the local oscillator 102, and outputs the second frequency control signal representing the frequency reduction amount $\Delta F_{RD}$ ($=F_{RF}-F_{LO0}-F_{BB}$) to the DDC 107 (step S102 of FIG. 5).

Through this operation, the local oscillator 102 generates the local signal of the local frequency $F_{LO}$ ($=F_{LO0}$) represented by the first frequency control signal. Further, the DDC 107 changes the signal so that the frequency thereof is lowered by the frequency reduction amount $\Delta F_{RD}$ ($=F_{RF}-F_{LO0}-F_{BB}$) represented by the second frequency control signal.

Thereafter, the mixer 103 converts the radio signal received by the antenna 11 into the intermediate signal based on the local signal generated by the local oscillator 102. In other words, the mixer 103 changes a signal SRF amplified by the first amplifier 101 so that the frequency thereof is lowered by the local frequency $F_{LO}$ ($=F_{LO0}$) as illustrated in FIG. 6A. Through this operation, the signal SRF of the radio frequency band is converted into an intermediate signal SIS of an intermediate frequency band with the intermediate frequency $F_{IS}$ ($=F_{RF}-F_{LO0}$) as the center.

Then, the DDC 107 converts the signal so that the frequency thereof is lowered by the frequency reduction amount $\Delta F_{RD}$ ($=F_{RF}-F_{LO0}-F_{BB}$) represented by the second frequency control signal. Through this operation, the intermediate signal SIS of the intermediate frequency band is converted into a base band signal SBB of a base band with the base frequency $F_{BB}$ as the center.

Further, the interference wave detector 111 detects the interference wave within the intermediate frequency band in the signal converted by the mixer 103.

When the interference wave information is output from the interference wave detector 111, the frequency controller 112 acquires the representative interference wave power based on the interference wave information. Meanwhile, when the interference wave information is not output from the interference wave detector 111, the frequency controller 112 acquires "0" as the representative interference wave power (step S103 of FIG. 5).

In the present example, the interference wave SIW within the intermediate frequency band is assumed to be detected in the signal converted by the mixer 103 as illustrated in FIG. 6A.

The frequency controller 112 stores the acquired representative interference wave power and the local frequency $F_{LO}$ at the current point in time in association with each other (step S104 of FIG. 5). Next, the frequency controller 112 determines whether the acquired representative interference wave power is larger than the permissible power (step S105 of FIG. 5).

Here, the representative interference wave power is assumed to be larger than the permissible power. In this case, the frequency controller 112 determines "Yes," and updates the local frequency $F_{LO}$ based on a value obtained by subtracting a certain frequency change amount α from the local frequency $F_{LO}$ at the current point in time (step S106 of FIG. 5). In the present example, the frequency change amount α has a positive value.

Then, the frequency controller 112 outputs the first frequency control signal representing the updated local frequency $F_{LO}$ (=$F_{LO0}$-α) to the local oscillator 102, and outputs the second frequency control signal representing the frequency reduction amount $\Delta F_{RD}$ (=$F_R$-$F_{LO0}$+α-$F_{BB}$) to the DDC 107 (step S107 of FIG. 5).

Through this operation, the local oscillator 102 generates the local signal of the local frequency $F_{LO}$ (=$F_{LO0}$-α) represented by the first frequency control signal. Further, the DDC 107 converts the signal so that the frequency thereof is lowered by the frequency reduction amount $\Delta F_{RD}$ (=$F_{RF}$-$F_{LO0}$+α-$F_{BB}$) represented by the second frequency control signal.

Thereafter, the mixer 103 converts the radio signal received by the antenna 11 into the intermediate signal based on the local signal generated by the local oscillator 102. In other words, the mixer 103 converts the signal SRF amplified by the first amplifier 101 so that the frequency thereof is lowered by the local frequency $F_{LO}$ (=$F_{LO0}$-α) as illustrated in FIG. 6B. Through this operation, the signal SRF of the radio frequency band is converted into the intermediate signal SIS of the intermediate frequency band with the intermediate frequency $F_{IS}$ (=$F_{RF}$-$F_{LO0}$+α) as the center.

In this way, the frequency controller 112 changes the local frequency $F_{LO}$ so that the intermediate frequency band of the intermediate signal SIS gets away from the band of the interference wave SIW within the first passband PB1 as illustrated in FIGS. 6A and 6B. In other words, a phenomenon that the state in which the intermediate frequency band of the intermediate signal SIS overlaps the band of the interference wave SIW changes to the state in which the intermediate frequency band does not overlap the band of the interference wave SIW is an example in which the intermediate frequency band gets away from the band of the interference wave SIW.

Then, the DDC 107 converts the signal so that the frequency is lowered by the frequency reduction amount $\Delta F_{RD}$ (=$F_{RF}$ $F_{LO0}$+α-$F_{BB}$) represented by the second frequency control signal. Through this operation, the intermediate signal SIS of the intermediate frequency band is converted into the base band signal SBB of the base band with the base frequency $F_{BB}$ as the center.

Thereafter, the frequency controller 112 determines whether the local frequency $F_{LO}$ at the current point in time is smaller than the lower limit value $F_{th}$ (step S108 of FIG. 5). Here, the local frequency $F_{LO}$ is assumed to be equal to or larger than the lower limit value $F_{th}$. In this case, the frequency controller 112 determines "No," returns to step S103, and repeatedly performs the process of steps S103 to S108.

Through this operation, the case in which the representative interference wave power becomes equal to or lower than the permissible power before the local frequency $F_{LO}$ becomes smaller than the lower limit value $F_{th}$ is considered. In this case, when the frequency controller 112 proceeds to step S105 of FIG. 5, the frequency controller 112 determines "No," and ends the frequency control process of FIG. 5.

Next, the case in which the local frequency $F_{LO}$ becomes smaller than the lower limit value $F_{th}$ before the representative interference wave power becomes equal to or lower than the permissible power is considered. In this case, when the process proceeds to step S108 of FIG. 5, the frequency controller 112 determines "Yes," and acquires a minimum interference wave frequency $F_{LOmin}$ from the local frequency stored in step S104 (step S109 of FIG. 5). The minimum interference wave frequency $F_{LOmin}$ is a local frequency stored in association with the minimum representative interference wave power.

Then, the frequency controller 112 sets (selects) the acquired minimum interference wave frequency $F_{LOmin}$ as the local frequency $F_{LO}$ (step S110 of FIG. 5). Next, the frequency controller 112 outputs the first frequency control signal representing the selected local frequency $F_{LO}$ (=$F_{LOmin}$) to the local oscillator 102, and outputs the second frequency control signal representing the frequency reduction amount $\Delta F_{RD}$ (=$F_{RF}$-$F_{LOmin}$-$F_{BB}$) to the DDC 107 (step S111 of FIG. 5).

Through this operation, the local oscillator 102 generates the local signal of the local frequency $F_{LO}$ (=$F_{LOmin}$) represented by the first frequency control signal. Further, the DDC 107 converts the signal so that the frequency is lowered by the frequency reduction amount $\Delta F_{RD}$ (=$F_{RF}$-$F_{LOmin}$-$F_{BB}$) represented by the second frequency control signal.

Thereafter, the frequency controller 112 ends the frequency control process of FIG. 5.

As described above, the transceiving device 1 according to the first embodiment includes the interference wave detector 111 that detects the interference wave within the intermediate frequency band in the signal converted by the mixer 103. The transceiving device 1 further includes the frequency controller 112 that changes the local frequency so that the intermediate frequency band gets away from the band of the interference wave when the interference wave is detected.

Through this configuration, it is possible to cause the intermediate frequency band to get away from the band of the interference wave. Thus, it is possible to easily separate the signal within the intermediate frequency band from the interference wave. As a result, the quality of a reception signal can be improved.

The transceiving device 1 according to the first embodiment further includes the first filter 105 that is configured to attenuate the signal outside the first passband having the band width larger than the width of the intermediate frequency band in the signal converted by the mixer 103. Further, the frequency controller 112 is configured to change the local frequency so that the intermediate frequency band gets away from the band of the interference wave within the first passband.

Through this configuration, it is possible to cause the intermediate frequency band to get away from the band of the interference wave within the range which is not attenuated by the first filter 105. As a result, the quality of the reception signal can be further improved.

In addition, the transceiving device 1 according to the first embodiment includes the DDC 107 that converts the signal that has passed through the first filter 105 based on the local frequency so that the frequency changes by the difference between the intermediate frequency and the base frequency.

Through this operation, even when the intermediate frequency band changes as the local frequency changes, the intermediate signal can be converted into the base band signal of the base band with a certain base frequency as the center.

Furthermore, the transceiving device 1 according to the first embodiment includes the second filter 108 which is configured to attenuate the signal outside the base band in the signal converted by the DDC 107.

Through this configuration, the signal can be attenuated based on the interference wave. As a result, the quality of the reception signal can be further improved.

In addition, in the transceiving device 1 according to the first embodiment, the interference wave detector 111 is configured to acquire the interference wave power which is the power of the interference wave. Further, the frequency controller 112 changes the local frequency $F_{LO}$ to minimize the acquired interference wave power when the interference wave is detected.

Through this configuration, the power of the interference wave can be reduced. As a result, the quality of the reception signal can be further improved.

Further, the transceiving device 1 according to the first embodiment is configured to change the local frequency $F_{LO}$ by the frequency change amount α, but may be configured to store a plurality of different candidate values in advance and sequentially change the local frequency $F_{LO}$ to the respective candidate values.

<Second Embodiment>

Next, a transceiving device according to a second embodiment of the present invention will be described. The transceiving device according to the second embodiment has the same configuration as the transceiving device according to the first embodiment except that the local frequency is decided based on the band of the interference wave so that the intermediate frequency band does not overlap the band of the interference wave. The following description will proceed focusing on the different point. In the description of the second embodiment, the same components as those in the first embodiment are denoted by the same reference numerals.

(Configuration)

Figure 7:
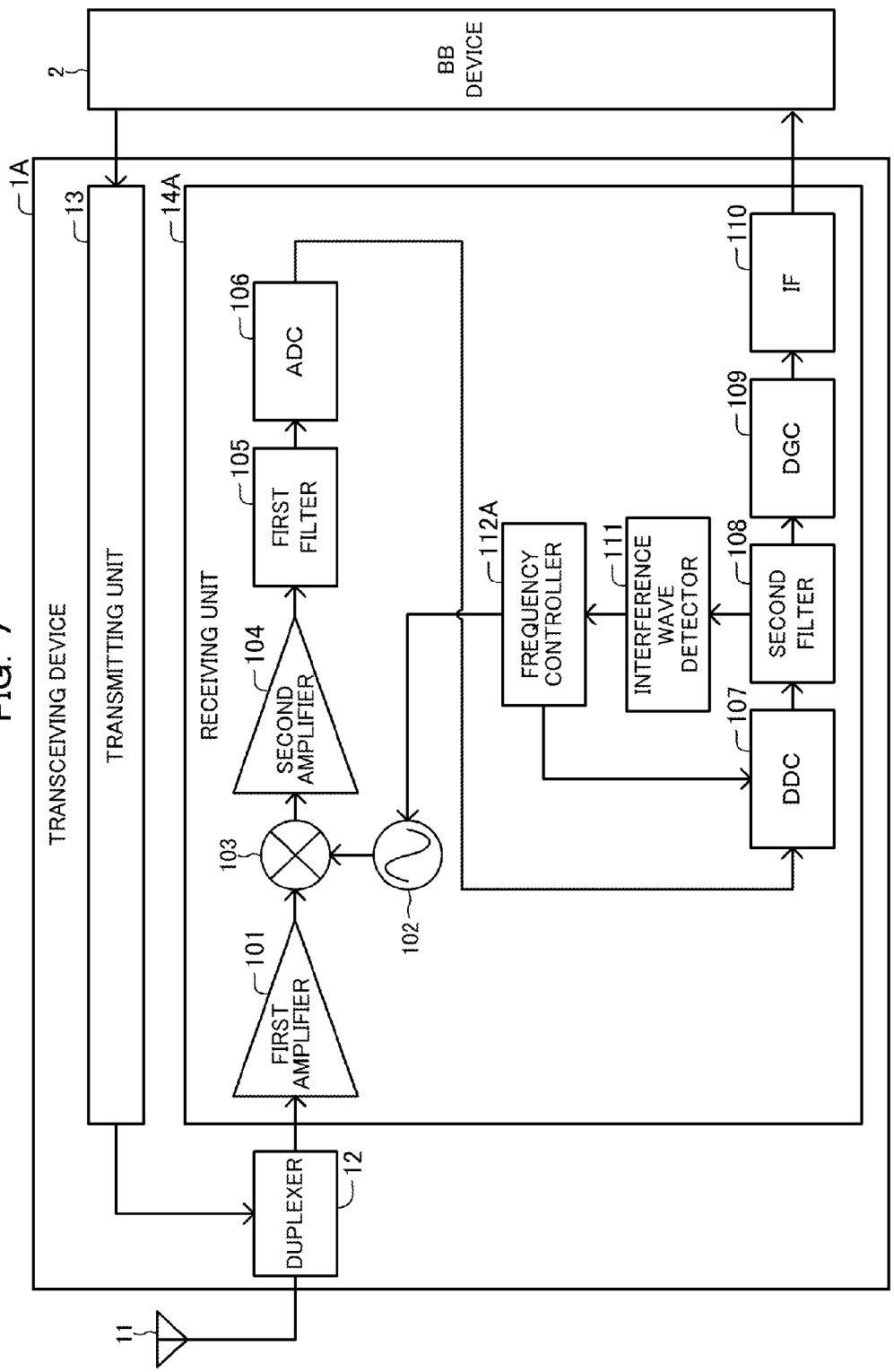
FIG. 7 is a diagram illustrating a configuration of a transceiving device according to a second embodiment.

A transceiving device 1A according to the second embodiment includes a receiving unit 14A instead of the receiving unit 14 as illustrated in FIG. 7. The receiving unit 14A according to the second embodiment has the same configuration as the receiving unit 14 except that the frequency controller 112A is provided instead of the frequency controller 112.

In the present example, the width (the first passband width) $W_{FP1}$ of the first passband of the first filter 105 is set to a value ($2W_{IS}+W_{IW}$) obtained by adding the band of the interference wave width $W_{IW}$ to the value $2W_{IS}$ which is twice as large as the intermediate frequency band width $W_{IS}$. The center of the first passband is set to the basic intermediate frequency $F_{IS0}$.

When the interference wave is detected by the interference wave detector 111, the frequency controller 112A changes the local frequency $F_{LO}$ so that the intermediate frequency band gets away from the band of the interference wave. In the present example, the frequency controller 112A changes the local frequency $F_{LO}$ so that the intermediate frequency band gets away from the band of the interference wave within the first passband.

For example, the frequency controller 112A selects the local frequency $F_{LO}$ from three local frequency candidate values (a first local frequency candidate $F_{LO0}$, a second local frequency candidate $F_{LO1}$, and a third local frequency candidate $F_{LO2}$) based on the interference wave information output from the interference wave detector 111. In the present example, the first local frequency candidate $F_{LO0}$ is the basic local frequency $F_{LO0}$.

The second local frequency candidate $F_{LO1}$ is preferably set so that the upper limit value of the frequency band (i.e., the intermediate frequency band) of the intermediate signal converted by the mixer 103 is identical to the upper limit value of the first passband of the first filter 105. Further, the third local frequency candidate $F_{LO2}$ is preferably set so that the lower limit value of the frequency band (i.e., the intermediate frequency band) of the intermediate signal converted by the mixer 103 is identical to the lower limit value of the first passband of the first filter 105.

In the present example, the second local frequency candidate $F_{LO1}$, and the third local frequency candidate $F_{LO2}$ are represented by Mathematical Formulas 2 and 3:

$$F_{LO1}=F_{LO0}-(W_{IS}+W_{IW})/2 \quad \text{(Mathematical Formula 2)}$$

$$F_{LO2}=F_{LO0}+(W_{IS}+W_{IW})/2 \quad \text{(Mathematical Formula 3)}$$

Further, in the present example, the frequency controller 112A selects the local frequency $F_{LO}$ from the three local frequency candidate values, but may select the local frequency $F_{LO}$ from the two local frequency candidate values, that is, the second local frequency candidate $F_{LO1}$ and the third local frequency candidate $F_{LO2}$.

When the representative interference wave power is equal to or lower than the certain permissible power, the frequency controller 112 selects the first local frequency candidate $F_{LO0}$ as the local frequency $F_{LO}$.

Further, in the case where the representative interference wave power is larger than the certain permissible power, the frequency controller 112 selects the second local frequency candidate $F_{LO1}$ as the local frequency $F_{LO}$ when the representative interference wave frequency is smaller than the basic intermediate frequency $F_{IS0}$.

Further, in the case where the representative interference wave power is larger than the certain permissible power, the frequency controller 112 selects the third local frequency candidate $F_{LO2}$ as the local frequency $F_{LO}$ when the representative interference wave frequency is equal to or larger than the basic intermediate frequency $F_{IS0}$.

In the present example, the representative interference wave power is the maximum value of the interference wave power. Alternatively, the representative interference wave power may be an average value of the interference wave power. Further, the representative interference wave frequency is a representative value of the interference wave frequency. In the present example, the representative interference wave frequency is an average value of the interference wave frequency. Further, the representative interference wave frequency may be a value obtained by weighted-averaging the interference wave frequency based on the interference wave power. Further, the representative interference wave frequency may be a frequency corresponding to the maximum interference wave power.

The frequency controller 112A outputs the first frequency control signal representing the selected local frequency $F_{LO}$ to the local oscillator 102.

Further, the frequency controller 112A calculates a value ($F_{RF}-F_{LO}-F_{BB}$) obtained by subtracting the base frequency $F_{BB}$ from a value obtained by subtracting the selected local frequency $F_{LO}$ from the radio frequency $F_{RF}$, as the frequency reduction amount $\Delta F_{RD}$. In addition, the frequency controller 112A outputs the second frequency control signal representing the calculated frequency reduction amount $\Delta F_{RD}$ to the DDC 107.

(Operation)

Next, an operation of the transceiving device 1A will be described with reference to FIGS. 8 to 11.

Figure 8:
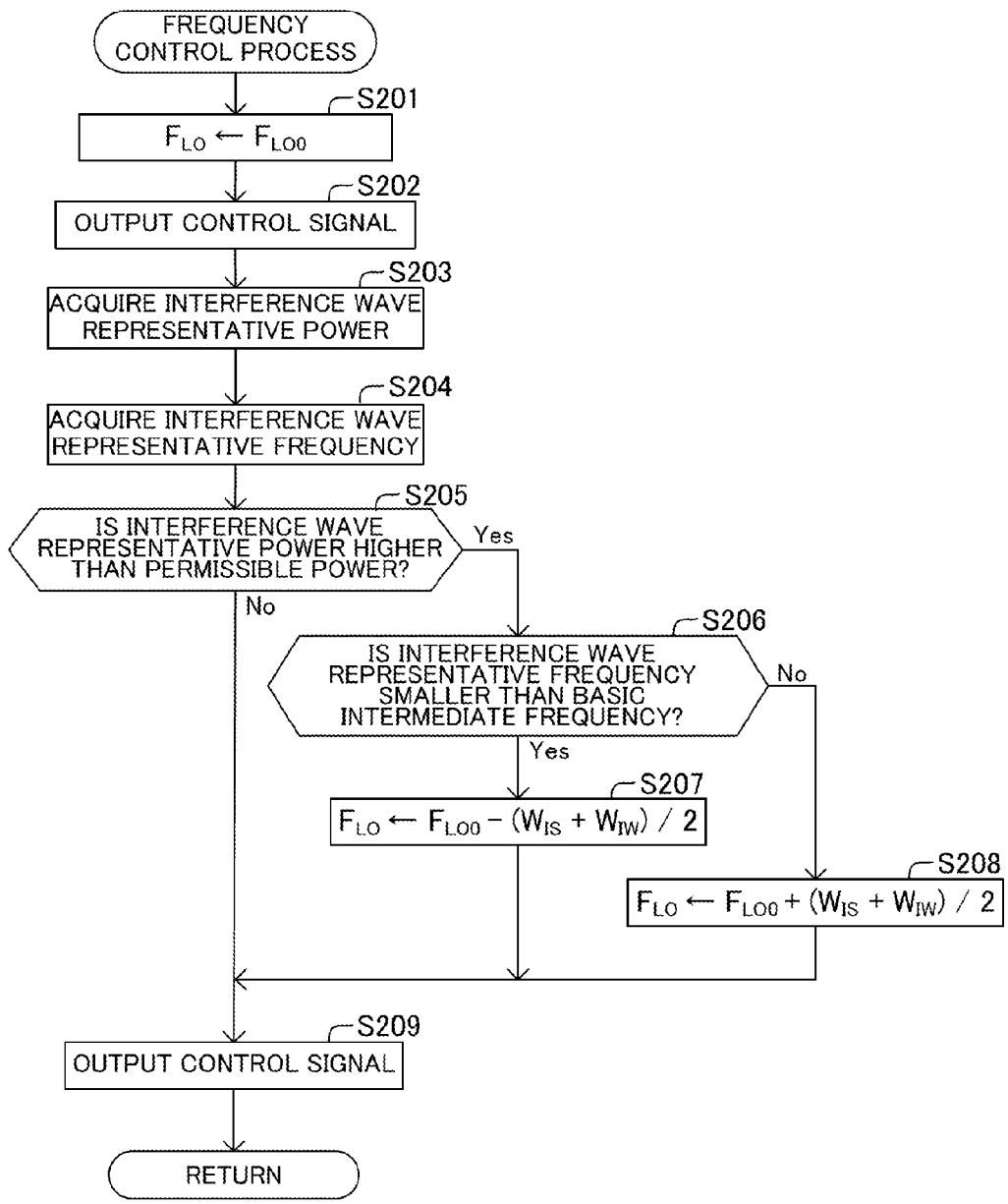
FIG. 8 is a flowchart illustrating a frequency control process performed by a frequency controller according to the second embodiment.
Figure 9:
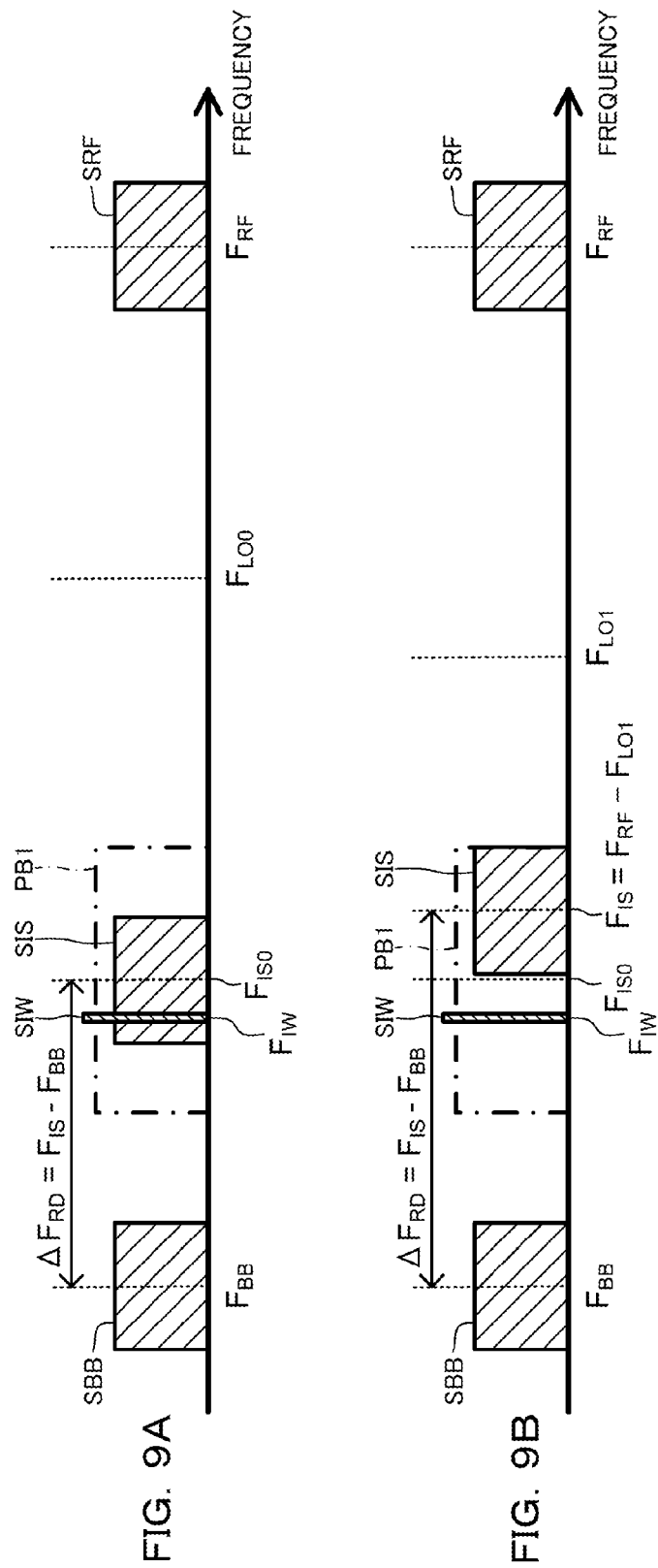
FIG. 9A is an explanatory diagram conceptually illustrating a relation between bands of signals before a local frequency is changed in the transceiving device according to the second embodiment.
FIG. 9B is an explanatory diagram conceptually illustrating a relation between bands of signals after a local frequency is changed in the transceiving device according to the second embodiment.
Figure 10:
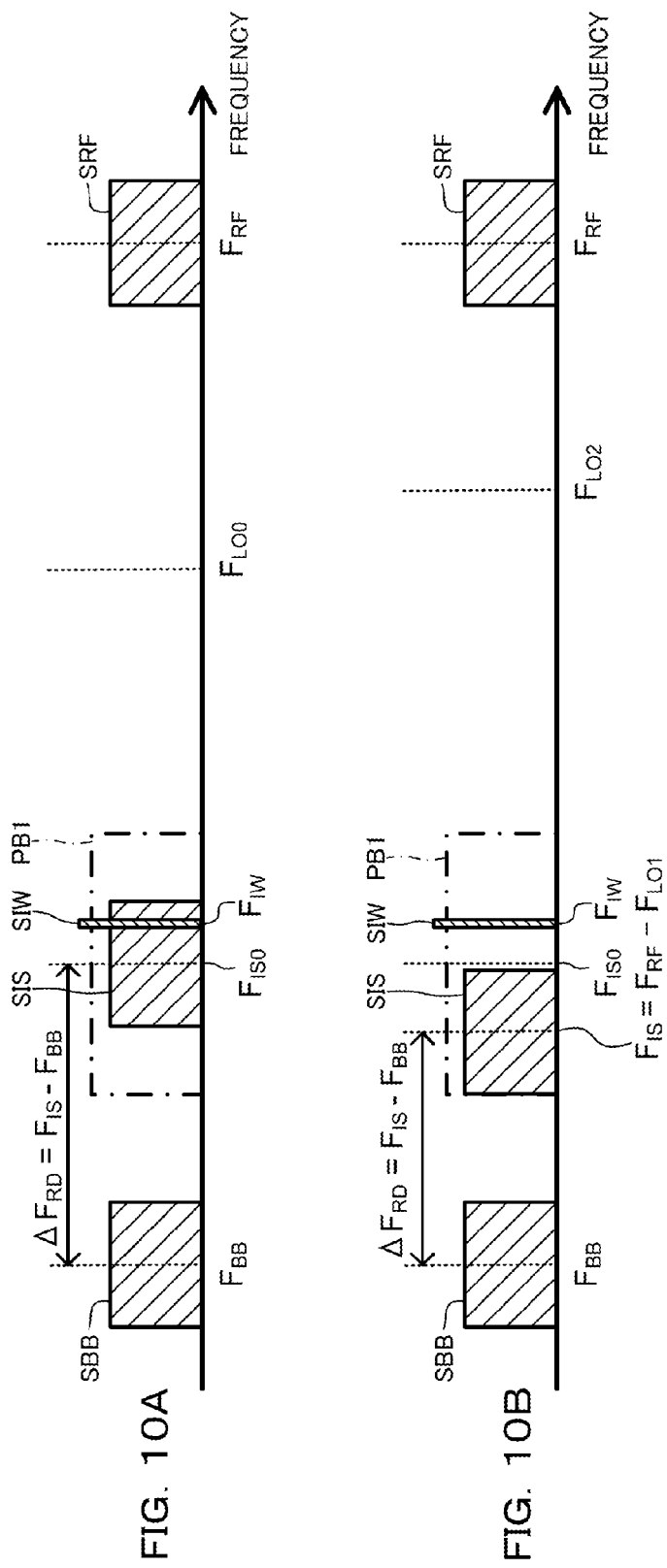
FIG. 10A is an explanatory diagram conceptually illustrating a relation between bands of signals before a local frequency is changed in the transceiving device according to the second embodiment.
FIG. 10B is an explanatory diagram conceptually illustrating a relation between bands of signals after a local frequency is changed in the transceiving device according to the second embodiment.

The frequency controller 112A performs a frequency control process illustrated in FIG. 8 at a certain timing instead of the frequency control process illustrated in FIG. 5. In the present example, the frequency controller 112A performs the frequency control process when the transceiving device 1A is activated. The frequency controller 112A may perform the frequency control process each time a certain execution period elapses or when the representative interference wave power is larger than a certain execution threshold value.

First of all, when execution of the frequency control process starts, the frequency controller 112A sets (selects) the basic local frequency $F_{LO0}$ as the local frequency $F_{LO}$ (step S201 of FIG. 8). Then, the frequency controller 112A outputs the first frequency control signal representing the selected local frequency $F_{LO}$ to the local oscillator 102, and outputs the second frequency control signal representing the frequency reduction amount $\Delta F_{RD}$ ($=F_{RF}-F_{LO0}-F_{BB}$) to the DDC 107 (step S202 of FIG. 8).

Through this operation, the local oscillator 102 generates the local signal of the local frequency $F_{LO}$ ($=F_{LO0}$) represented by the first frequency control signal. Further, the DDC 107 changes the signal so that the frequency thereof is lowered by the frequency reduction amount $\Delta F_{RD}$ ($=F_{RF}-F_{LO0}-F_{BB}$) represented by the second frequency control signal.

Thereafter, the mixer 103 converts the radio signal received by the antenna 11 into the intermediate signal based on the local signal generated by the local oscillator 102. In other words, the mixer 103 changes the signal SRF amplified by the first amplifier 101 so that the frequency thereof is lowered by the local frequency $F_{LO}$ ($=F_{LO0}$) as illustrated in FIG. 9A. Through this operation, the signal SRF of the radio frequency band is converted into the intermediate signal SIS of the intermediate frequency band with the intermediate frequency $F_{IS}$ ($=F_{RF}-F_{LO0}$) as the center.

Then, the DDC 107 converts the signal so that the frequency thereof is lowered by the frequency reduction amount $\Delta F_{RD}$ ($=F_{RF}-F_{LO0}-F_{BB}$) represented by the second frequency control signal. Through this operation, the intermediate signal SIS of the intermediate frequency band is converted into the base band signal SBB of the base band with the base frequency $F_{BB}$ as the center.

Further, the interference wave detector 111 detects the interference wave within the intermediate frequency band in the signal converted by the mixer 103.

When the interference wave information is output from the interference wave detector 111, the frequency controller 112A acquires the representative interference wave power based on the interference wave information. However, when the interference wave information is not output from the interference wave detector 111, the frequency controller 112A acquires "0" as the representative interference wave power (step S203 of FIG. 8).

In the present example, the interference wave SIW of the band which is within the intermediate frequency band and lower than the basic intermediate frequency $F_{IS0}$ is assumed to be detected in the signal converted by the mixer 103 as illustrated in FIG. 9A.

Further, when the interference wave information is output from the interference wave detector 111, the frequency controller 112A acquires the representative interference wave frequency $F_{IW}$ based on the interference wave information. However, when the interference wave information is not output from the interference wave detector 111, the frequency controller 112A acquires "0" as the representative interference wave frequency $F_{IW}$ (step S204 of FIG. 8).

The frequency controller 112A determines whether the acquired representative interference wave power is larger than the permissible power (step S205 of FIG. 8).

Here, the representative interference wave power is assumed to be larger than the permissible power. In this case, the frequency controller 112A determines "Yes," and determines whether the acquired representative interference wave frequency $F_{IW}$ is smaller than the basic intermediate frequency $F_{IS0}$ (step S206 of FIG. 8).

According to the above assumption, the representative interference wave frequency $F_{IW}$ is smaller than the basic intermediate frequency $F_{IS0}$ and thus the frequency controller 112A determines "Yes," selects the second local frequency candidate $F_{LO1}$ ($=F_{LO0})-(W_{IS}+W_{IW})/2$) as the local frequency $F_{LO}$ (step S207 of FIG. 8).

Then, the frequency controller 112A outputs the first frequency control signal representing the selected local frequency $F_{LO}$ ($=F_{LO1}$) to the local oscillator 102, and outputs the second frequency control signal representing the frequency reduction amount $\Delta F_{RD}$ ($=F_{RF}-F_{LO1}-F_{BB}$) to the DDC 107 (step S209 of FIG. 8).

Through this operation, the local oscillator 102 generates the local signal of the local frequency $F_{LO}$ ($=F_{LO1}$) represented by the first frequency control signal. Further, the DDC 107 converts the signal so that the frequency thereof is lowered by the frequency reduction amount $\Delta F_{RD}$ ($=F_{RF}-F_{LO1}-F_{BB}$) represented by the second frequency control signal.

Thereafter, the mixer 103 converts the radio signal received by the antenna 11 into the intermediate signal based on the local signal generated by the local oscillator 102. In other words, the mixer 103 converts the signal SRF amplified by the first amplifier 101 so that the frequency thereof is lowered by the local frequency $F_{LO}$ ($=F_{LO1}$) as illustrated in FIG. 9B. Through this operation, the signal SRF of the radio frequency band is converted into the intermediate signal SIS of the intermediate frequency band with the intermediate frequency $F_{IS}$ ($=F_{RF}-F_{LO1}$) as the center.

In this way, the frequency controller 112A changes the local frequency $F_{LO}$ so that the intermediate frequency band of the intermediate signal SIS does not overlap the band of the interference wave SIW within the first passband PB1 as illustrated in FIGS. 9A and 9B.

Then, the DDC 107 converts the signal so that the frequency thereof is lowered by the frequency reduction amount $\Delta F_{RO}$ ($=F_{RF}-F_{LO1}-F_{BB}$) represented by the second frequency control signal. Through this operation, the intermediate signal SIS of the intermediate frequency band is converted into the base band signal SBB of the base band with the base frequency $F_{BB}$ as the center.

Thereafter, the frequency controller 112A ends the frequency control process of FIG. 8.

Next, the case in which the interference wave SIW of the band which is within the intermediate frequency band and higher than the basic intermediate frequency $F_{IS0}$ is detected in the signal converted by the mixer 103 as illustrated in FIG. 10A is considered.

In this case, when the frequency controller 112A proceeds to step S206 of FIG. 8, the frequency controller 112A determines "No," and selects the third local frequency candidate $F_{LO2}$ ($=F_{LO0}+(W_{IS}+W_{IW})/2$) as the local frequency $F_{LO}$ (step S208 of FIG. 8).

Then, the frequency controller 112A outputs the first frequency control signal representing the selected local frequency $F_{LO}$ ($=F_{LO2}$) to the local oscillator 102, and outputs the second frequency control signal representing the frequency reduction amount $\Delta F_{RD}$ ($=F_{RF}-F_{LO2}-F_{BB}$) to the DDC 107 (step S209 of FIG. 8).

Through this operation, the local oscillator 102 generates the local signal of the local frequency $F_{LO}$ ($=F_{LO2}$) represented by the first frequency control signal. Further, the DDC 107 converts the signal so that the frequency thereof is lowered by the frequency reduction amount $\Delta F_{RD}$ (=$F_{RF}$-$F_{LO2}$-$F_{BB}$) represented by the second frequency control signal.

Thereafter, the mixer 103 converts the radio signal received by the antenna 11 into the intermediate signal based on the local signal generated by the local oscillator 102. In other words, the mixer 103 converts the signal SRF amplified by the first amplifier 101 so that the frequency thereof is lowered by the local frequency $F_{LO}$ (=$F_{LO2}$) as illustrated in FIG. 10B. Through this operation, the signal SRF of the radio frequency band is converted into the intermediate signal SIS of the intermediate frequency band with the intermediate frequency $F_{IS}$ (=$F_{RF}$-$F_{LO2}$) as the center.

In this way, the frequency controller 112A changes the local frequency $F_{LO}$ so that the intermediate frequency band of the intermediate signal SIS does not overlap the band of the interference wave SIW within the first passband PB1 as illustrated in FIGS. 10A and 10B.

Then, the DDC 107 converts the signal so that the frequency is lowered by the frequency reduction amount $\Delta F_{RD}$ (=$F_{RF}$-$F_{LO2}$-$F_{BB}$) represented by the second frequency control signal. Through this operation, the intermediate signal SIS of the intermediate frequency band is converted into the base band signal SBB of the base band with the base frequency $F_{BB}$ as the center.

Thereafter, the frequency controller 112A ends the frequency control process of FIG. 8.

Figure 11:
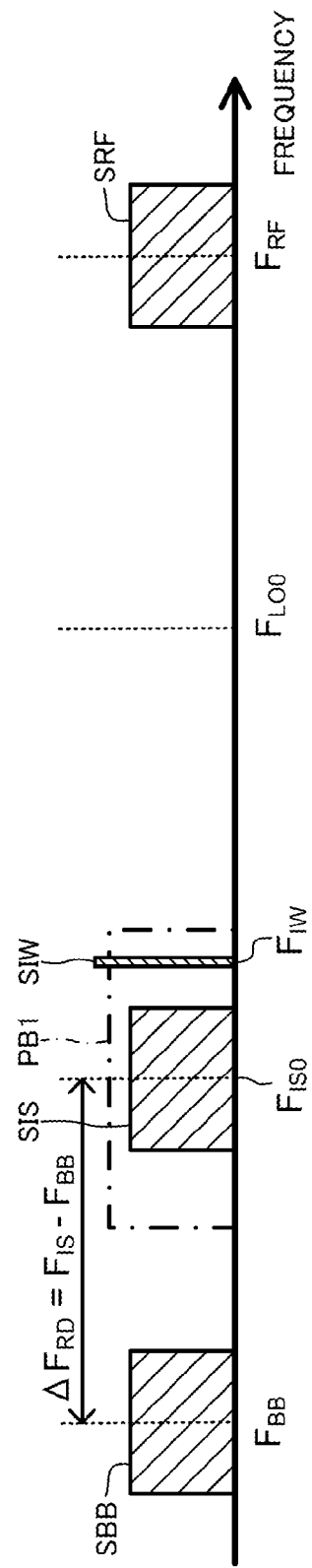
FIG. 11 is an explanatory diagram conceptually illustrating a relation of bands of signals in the transceiving device according to the second embodiment.

Next, the case in which the interference wave SIW is outside the intermediate frequency band in the signal converted by the mixer 103 as illustrated in FIG. 11 is considered.

In this case, when the process proceeds to step S205 of FIG. 8, the frequency controller 112A determines "No," outputs the first frequency control signal representing the local frequency $F_{LO}$ (=$F_{LO0}$) selected in step S201 to the local oscillator 102, and outputs the second frequency control signal representing the frequency reduction amount $\Delta F_{RD}$ (=$F_{RF}$-$F_{LO0}$-$F_{BB}$) to the DDC 107 (step S209 of FIG. 8). In other words, in this case, the local frequency $F_{LO}$ remains with no change.

Thereafter, the frequency controller 112A ends the frequency control process of FIG. 8.

As described above, the transceiving device 1A according to the second embodiment can obtain the same operation and effects as in the transceiving device 1 according to the first embodiment.

In the transceiving device 1A according to the second embodiment, the width of the first passband of the first filter 105 is set to the width obtained by adding the band width $W_{IW}$ of the interference wave to the width which is twice as large as the width $W_{IS}$ of the intermediate frequency band.

Through this configuration, in the range which is not attenuated by the first filter 105, the intermediate frequency band can reliably be arranged as the band other than the band of the interference wave. As a result, the quality of the reception signal can be further reliably improved.

In addition, in the transceiving device 1A according to the second embodiment, when the frequency controller 112A detects the interference wave, the local frequency $F_{LO}$ is changed so that the intermediate frequency band does not overlap the band of the interference wave within the first passband.

Through this configuration, in the range which is not attenuated by the first filter 105, the intermediate frequency band can be prevented from overlapping the band of the interference wave. As a result, the quality of the reception signal can be further reliably improved.

The present invention has been described with reference to the exemplary embodiments, but the present invention is not limited to the above embodiments. In the configuration and details of the present invention, various changes which can be understood by a person skilled in the art can be made within the scope of the present invention.

In the above embodiments, the transceiving device may be a receiving device including no transmitting unit. Further, in the above embodiments, the transceiving device may include a first antenna for transmitting a radio signal and a second antenna for receiving a radio signal.

Further, in the above embodiments, the receiving unit may be mounted in a radio base station or a wireless terminal (e.g., a mobile station) as a receiving device.

Further, in the above embodiments, the interference wave detector 111 is configured to detect the interference wave in the signal that has passed through the second filter 108 but may be configured to detect the interference wave in a signal that does not pass through the second filter 108 (i.e., the signal output from the DDC 107). In this case, the interference wave detector 111 may be configured to detect the interference wave based on a relation between the frequency corresponding to the average power value higher than the threshold power and the intermediate frequency band.

Further, in the above embodiments, each of the mixer 103 and the DDC 107 converts the signal to lower the frequency, but at least one of the mixer 103 and the DDC 107 may convert the signal to increase the frequency.

Further, in the above embodiments, the respective functions of the receiving device may be implemented by hardware such as a field programmable gate array (FPGA). The respective functions of the receiving device may be implemented using hardware including a processing device (e.g., a central processing unit (CPU), or a digital signal processor (DSP)) and a storage device (e.g., a read only memory (ROM) or a random access memory (RAM)).

Figure 12:
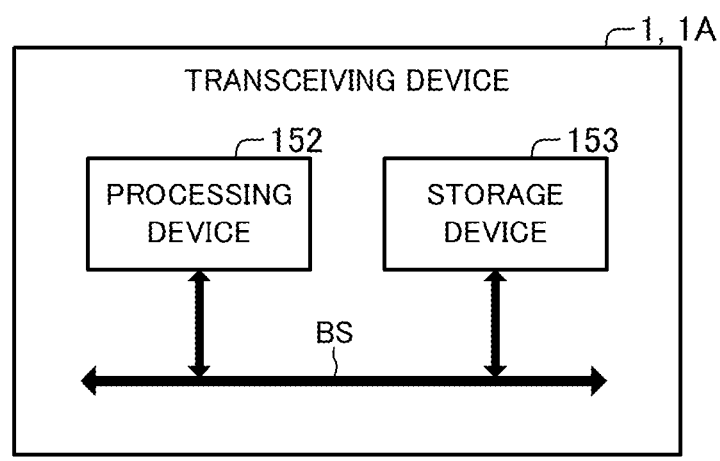
FIG. 12 is a diagram illustrating a configuration of a transceiving device according to a modification of the first and second embodiments.

In this case, for example, the transceiving device 1 or 1A includes a processing device 152 and a storage device 153 as illustrated in FIG. 12. The processing device 152 is connected with the storage device 153 via a bus BS. The processing device 152 is configured to implement the respective functions of the DDC 107, the second filter 108, the DGC 109, the interference wave detector 111, and the frequency controller 112 or the frequency controller 112A in collaboration with the storage device 153.

Further, arbitrary combinations of the above embodiments and the modification may be employed as other modifications of the above embodiments within the scope not departing from the gist of the present invention.

According to the control device of the present disclosure, the quality of a reception signal can be improved.

All examples and conditional language provided herein are intended for pedagogical purposes of aiding the reader in understanding the invention and the concepts contributed by the inventor to furthering the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A control device, comprising:
an interference wave detector that detects an interference wave within an intermediate frequency band in a signal converted by a mixer that converts a reception signal of a radio frequency band with a certain radio frequency as a center into an intermediate signal of the intermediate frequency band based on a signal of a local oscillation frequency different from the radio frequency;

a frequency controller that changes the local oscillation frequency so that the intermediate frequency band gets away from a band of the interference wave when the interference wave is detected; and a frequency converter that lowers a frequency of the intermediate signal into a base frequency by an amount calculated by subtracting the local oscillation frequency and the base frequency from the certain radio frequency.

2. The control device according to claim 1, wherein the interference wave detector acquires interference wave power which is power of the interference wave, and the frequency controller changes the local oscillation frequency to minimize the acquired interference wave power when the interference wave is detected.

3. The control device according to claim 1, wherein the frequency controller changes the local oscillation frequency so that the intermediate frequency band gets away from the band of the interference wave within a passband that is outside a band in which a first filter attenuates the signal converted by the mixer and has a band width larger than a width of the intermediate frequency band.

4. The control device according to claim 3, wherein the width of the passband has a value obtained by adding the width of the band of the interference wave to a width which is twice as large as the width of the intermediate frequency band.

5. The control device according to claim 3, wherein the frequency controller changes the local oscillation frequency so that the intermediate frequency band does not overlap the band of the interference wave within the passband when the interference wave is detected.

6. The control device according to claim 3, wherein the frequency converter converts a signal that has passed through the first filter based on the local oscillation frequency so that a frequency changes by a difference between a center frequency of the intermediate frequency band and the base frequency.

7. The control device according to claim 6, further comprising, a second filter that attenuates a signal outside a base band with the base frequency as a center in the signal converted by the frequency converter.

8. A frequency control method, comprising:

detecting an interference wave within an intermediate frequency band in a signal converted by a mixer that converts a reception signal of a radio frequency band with a certain radio frequency as a center into an intermediate signal of the intermediate frequency band based on a signal of a local oscillation frequency different from the radio frequency;

changing the local oscillation frequency so that the intermediate frequency band gets away from a band of the interference wave when the interference wave is detected; and lowering a frequency of the intermediate signal into a base frequency by an amount calculated by subtracting the local oscillation frequency and the base frequency from the certain radio frequency.

9. The frequency control method according to claim 8, further comprising:

attenuating a signal outside a passband having a band width larger than a width of the intermediate frequency band in the converted signal; and changing the local oscillation frequency so that the intermediate frequency band gets away from the band of the interference wave within the passband.

10. The frequency control method according to claim 9, wherein the width of the passband has a value obtained by adding the width of the band of the interference wave to a width which is twice as large as the width of the intermediate frequency band.

11. A receiving device, comprising:

an oscillator that generates a signal of a local oscillation frequency different from a certain radio frequency;

a mixer that converts a reception signal of a radio frequency band with the radio frequency as a center into an intermediate signal of an intermediate frequency band based on the generated signal;

an interference wave detector that detects an interference wave within the intermediate frequency band in the signal converted by the mixer;

a frequency controller that changes the local oscillation frequency so that the intermediate frequency band gets away from a band of the interference wave when the interference wave is detected; and a frequency converter that lowers a frequency of the intermediate signal into a base frequency by an amount calculated by subtracting the local oscillation frequency and the base frequency from the certain radio frequency.

12. The receiving device according to claim 11, wherein the interference wave detector acquires interference wave power which is power of the interference wave, and the frequency controller changes the local oscillation frequency to minimize the acquired interference wave power when the interference wave is detected.

13. The receiving device according to claim 11, further comprising, a first filter that attenuates a signal outside a passband having a band width larger than a width of the intermediate frequency band in the signal converted by the mixer, wherein the frequency controller changes the local oscillation frequency so that the intermediate frequency band gets away from the band of the interference wave within the passband.

14. The receiving device according to claim 13, wherein the width of the passband has a value obtained by adding the width of the band of the interference wave to a width which is twice as large as the width of the intermediate frequency band.

15. The receiving device according to claim 13, wherein the frequency controller changes the local oscillation frequency so that the intermediate frequency band does not overlap the band of the interference wave within the passband when the interference wave is detected.

16. The receiving device according to claim 13, wherein the frequency converter converts a signal that has passed through the first filter based on the local oscillation frequency so that a frequency changes by a difference between a center frequency of the intermediate frequency band and the base frequency.

17. The receiving device according to claim 16, further comprising, a second filter that attenuates a signal outside a base band with the base frequency as a center in the signal converted by the frequency converter.

* * * * *